(12) United States Patent
Engelmann

(10) Patent No.: US 6,958,459 B2
(45) Date of Patent: Oct. 25, 2005

(54) CONTACT SWITCHING ARRANGEMENT

(75) Inventor: Harry Engelmann, Ingelheim (DE)

(73) Assignee: Schott AG, Mainz (DE)

(*) Notice: Subject to any disclaimer, the term of this patent is extended or adjusted under 35 U.S.C. 154(b) by 0 days.

(21) Appl. No.: 10/841,960

(22) Filed: May 7, 2004

(65) Prior Publication Data

US 2005/0006213 A1    Jan. 13, 2005

(30) Foreign Application Priority Data

May 7, 2003    (DE) ................................. 103 20 548

(51) Int. Cl.[7] ........................ H01H 9/00; H03K 17/975
(52) U.S. Cl. ...................... 200/600; 200/310; 307/112; 341/33
(58) Field of Search ................. 200/308–317, 200/512–517, 600, 5 R, 5 A; 341/33; 307/109–140

(56) References Cited

U.S. PATENT DOCUMENTS

| | | | | |
|---|---|---|---|---|
| 4,308,439 A | * | 12/1981 | Itoh .................. | 200/308 X |
| 4,413,252 A | * | 11/1983 | Tyler et al. ................. | 341/33 |
| 4,531,033 A | * | 7/1985 | Schmid et al. .............. | 200/314 |
| 5,594,222 A | | 1/1997 | Caldwell | |
| 5,917,165 A | * | 6/1999 | Platt et al. .................. | 200/600 |
| 6,265,682 B1 | * | 7/2001 | Lee ............................. | 200/600 |

FOREIGN PATENT DOCUMENTS

| | | |
|---|---|---|
| EP | 0 859 467 A1 | 8/1998 |
| EP | 0 962 807 A2 | 12/1999 |

* cited by examiner

*Primary Examiner*—James R. Scott
(74) *Attorney, Agent, or Firm*—Pauley Petersen & Erickson

(57) ABSTRACT

A contact switching arrangement with a flat electrically non-conducting cover which forms a switching area on a top facing the user, and has an underside facing away from the user, at which at least one electrode is arranged and is connected with a switching arrangement for triggering a contact signal when a finger of the user or a similar conducting body approaches. The cover has a light-reflecting, electrically non-conducting film, at least over portions, which acts as a non-conductor. The contact switching arrangement is for use in connection with control panels of electronic devices, for example.

33 Claims, 4 Drawing Sheets

CONTACT SWITCHING ARRANGEMENT

BACKGROUND OF THE INVENTION

1. Field of the Invention

This invention relates to a contact switching arrangement with a flat, electrically non-conducting cover, which forms a switching area on a top facing the user, and has an underside facing away from the user, on which at least one electrode is arranged and is connected with a switching arrangement for triggering a contact signal when a finger of the user, or similar conducting body, approaches the switching area.

2. Discussion of Related Art

Capacitive contact switches, operating on the basis of electric field effects, for example, are known in the prior art, such as described in U.S. Pat. No. 5,594,222 or European Patent Reference EP 0 859 467 A1.

Such contact switches are generally employed for trigger switching processes through a continuous surface made of glass or plastic. For this purpose the contact switches are arranged behind the surface which, for example, represents the control panel of an electrical or electrically controllable device, a cooking surface made of glass ceramic material, or other input unit. The switching process is then triggered by touching the surface near the contact switch, wherein the actual switching function is performed by electronic switches or relays.

The contact switches based on electrical field effects, or the capacitive contact switches generally have an electrode arranged behind a continuous cover near the switching area. The switching function is triggered if a conducting body of sufficient size, for example a human finger, is near the electrode.

In contact switches common in the prior art, two electrodes are located on the side of the cover facing away from the user. A possibly transparent electrode is arranged on the side facing the user, and covers the two lower electrodes. The lower electrodes are controlled by an electronic device so that they act as series connection of two capacitors. In this case the coupling is provided via the upper electrode. If the user touches the upper electrode, it is connected to ground and the coupling of the signals is significantly weakened.

A contact switch is also known from the prior art, on which two electrodes are arranged next to each other only on an underside of the cover. The two electrodes are controlled so that an electrical alternating field is built up which penetrates the continuous cover. The electrical alternating field is disturbed when touching the switching area. Such a disturbance can then be detected by a suitable electrical circuit.

The cover, or area, must not be electrically conductive in this case, or else the electrical fields being built up would be shielded. Thus the cover represents a non-conductor.

For design reasons, the control panels of electronic devices in particular are often formed as metallic surfaces. Such metals are generally not transparent to electromagnetic radiation, and thus it is shielded by the metal. Thus the known contact switches cannot be actuated through closed metallic surfaces. This also applies to metallized surfaces of glass or transparent plastic, which also act as shields against electromagnetic radiation.

A foil which is transparent to electrical fields is offered by the 3M Company under the name "Radiant Mirror Film". Such a film or foil has several polymer layers. With a smooth embodiment of the foil, more than 95% of visible light in the wave range of 400 to 700 nm are mirror-reflected at an angle of incidence of 0 to 90°. The structure and function of such a polymer film is described in European Patent Reference EP 0 962 807 A2, for example. Here, an especially great light reflection is achieved by a layer structure of double-refracting organic materials, which lends a metallic mirrored appearance to the film. The film is non-conductive and thus is suited as a non-conductor with capacitive contact switches, or those based on electrical field effects.

SUMMARY OF THE INVENTION

It is one object of this invention to provide a contact switching arrangement wherein a flat cover has a metallic appearance, but wherein the function of the contact switching arrangement is not hindered.

This object of this invention is attained by embodiments of this invention as described in this specification and in the claims.

Accordingly, the cover has a film, at least over some portions, which reflects light and is electrically non-conducting, as the non-conductor. Because of its reflecting properties, such a film appears to the user to be a metallic surface but the electrical fields are not shielded.

In accordance with one preferred embodiment of this invention, the film is formed by a multi-layered polymer film, which is reflecting in a mirror-like manner. Such a film is free of metal and electrically non-conductive. The film can be easily connected with other materials, is flexible, and provides an almost complete light reflection in the visible range.

In this case the multi-layer polymer film can reflect more than 95% of visible light in the wavelength range of lambda=400 nm to 700 nm, wherein, because of the double-refracting properties of the layers, light can be mirror-reflected at an angle of incidence of 0° to 90°.

In accordance with one embodiment of this invention, two lower electrodes are arranged next to each other on an underside of the cover, and an upper electrode is arranged on the switching area, and has a length that covers the two electrodes arranged on the underside, which are wired together as a series connection of two capacitors and are capacitively connected via the upper electrode. Such a contact switching arrangement is simply constructed, however, for design reasons the upper electrode is often aesthetically disturbing.

As one solution, the upper electrode can be made of a transparent material.

In accordance with a further preferred embodiment, two electrodes are arranged next to each other on the underside of the cover, which are connected with a switching arrangement for generating an electrical alternating field which penetrates the cover at least in the region of or near the switching area, and for detecting disturbances of the electrical alternating field in case of the approach of the finger of the user, or of a similar conducting body, to the switching area. With such contact switching arrangements the upper electrode is omitted. The electrodes are protected against mechanical effects behind the cover. The design of the surface can be freely chosen. Also, if required the electrodes can be arranged in a cost-effective manner on an electronic printed circuit board.

Thus the cover can be made directly from the light-reflecting film. The switching process is triggered by touching the film in the region of or near the switching area.

A particularly rugged contact switching arrangement, in which the electronic devices arranged underneath the cover are effectively protected against mechanical effects and moisture, is formed because the cover is formed of a transparent plate, which has the switching area on the top facing the user, and the light-reflecting film on the underside facing away from the user. Thus the light-reflecting film is protected against mechanical effects by the transparent plate.

In accordance with another embodiment, the cover can be formed by a transparent plate which has the light-reflecting film and the switching area on the top facing the user.

For providing a dependable connection between the light-reflecting film and the transparent plate, the film can be applied to the plate by lamination, heat-sealing, gluing or similar fixed and planar connections.

In accordance with this invention, the transparent plate can be made of glass, plastic or a similar transparent material. The transparency of the plate assures that the user sees the light-reflecting film, so that a metallic appearance is thus created.

Different design effects are achieved because the light-reflecting film has a smooth, mirrored, or alternatively a structured surface, which reflects light in a diffuse manner. Thus it is possible to create a visual appearance similar to a brushed high-grade steel surface, for example.

In accordance with another embodiment, the light-reflecting film can permit at least a slight transmission of visible light. This allows an at least partial back-lighting of the film by a light source.

Thus, one or several illuminated displays can be arranged on the underside of the cover or of the light-reflecting film facing away from the user.

These illuminated displays can be formed by lamps, light-emitting diodes, self-illuminated graphic displays, 7-segment displays, backlit liquid crystal displays, backlit symbols or similar optical displays radiating through the light-reflecting film. With the aid of such displays it is possible, for example, to represent the switched state of the contact switching arrangement, its position, or also further information.

In a simple manner, the position of the switching area can be identified by at least one symbolic device or similar marking on the cover and/or on the light-reflecting film. This makes it easier for the user to find the desired contact switching arrangement.

In a further embodiment of this invention, the light-reflecting film can be flexible, and the flat cover can be curved, angled or to have similar shapes differing from the flat shape, at least in some areas. This allows additional design possibilities.

BRIEF DESCRIPTION OF THE DRAWINGS

This invention is explained in greater detail in view of preferred embodiments and by making reference to the drawings, wherein.

DESCRIPTION OF PREFERRED EMBODIMENTS

Figure 1:
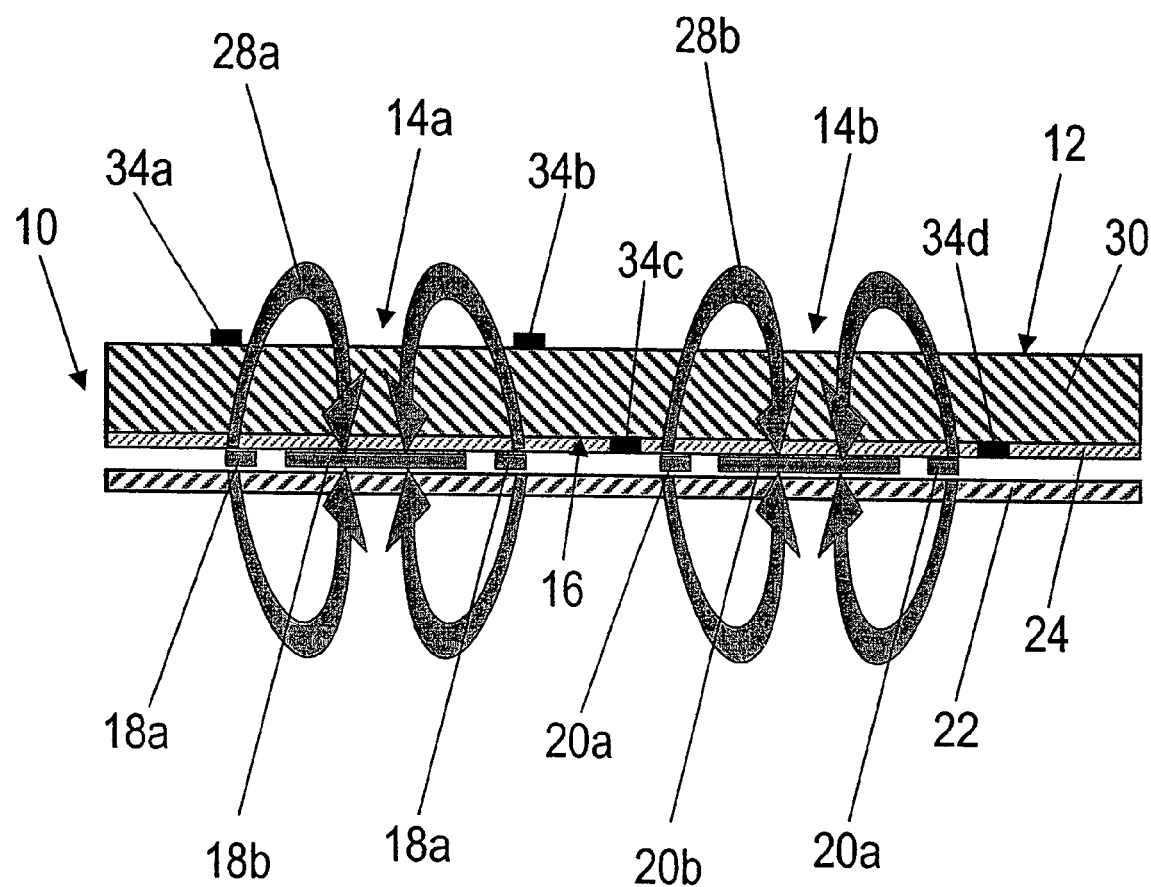
FIG. 1 shows a schematic plan view in section of a layout of two contact switching arrangements based on electrical field effects in accordance with one embodiment, wherein the light-reflecting film is applied on a side of a transparent plate facing away from the user.

FIG. 1 shows, in a schematic plan view and in section, a layout of two contact switching arrangements based on an electrical field effect in accordance with one embodiment of this invention. On a flat continuous cover 10, a first actuating area 14a is arranged on a top of a left contact switching arrangement, and a second actuating area 14b on a right contact switching arrangement. The actuating areas 14a and 14b are arranged on a transparent, non-conducting plate 30 of glass or plastic. A multi-layer polymer film 24 is attached by lamination to the underside of the plate 30 facing away from the user.

The multi-layer polymer film can be, for example a foil which is offered by the 3 M Company under the name "Radiant Mirror Film". Such a film, or such a foil consists of several polymer layers. With a smooth embodiment of the foil, more than 95% of visible light in the wave range of 400 nm to 700 nm are mirror-reflected at an angle of incidence of 0 to 90°. Here, an especially great light reflection is achieved with a layer structure of double-refracting organic materials, which lends a metallic mirrored appearance to the film. The film is non-conductive and thus is suited as a non-conductor with capacitive contact switches, or those based on electrical field effects.

Two electrodes 18a and 18b, or 20a and 20b, are assigned to each actuating area 14a or 14b underneath the polymer film 24 at the underside 16 of the cover 10. The electrodes 18a, 18b, 20a and 20b rest flat against the polymer film 24 or are only slightly distanced from it, and extend substantially parallel with the polymer film 24 or the plate 30. The electrodes 18b and 20b are surrounded in a ring shape by the electrodes 18a or 20a.

Each of the two electrodes 18a, 18b, or 20a and 20b, is controlled to build up an electrical alternating field 28a or 28b. The alternating fields 28a and 28b penetrate the polymer film 24, as well as the plate 30. The electrodes 18a, 18b, or 20a and 20b, are arranged on an electronic printed circuit board 22, which has an electronic switching arrangement (not shown) for building up the electrical alternating fields 28a and 28b. The electrical alternating field 28 is disturbed when the switching area 14a is touched, which is detected by an electrical switching arrangement (not shown) also arranged on the electronic printed circuit board 22. It is thus possible to trigger a switching process for electronic devices to be controlled. When touching the switching area 14b, for example with a finger of the user, the electrical alternating field 28b is disturbed, by which a switching process is triggered at the right contact switching arrangement.

So that the user can dependably find the actuating area 14a of the left contact switching arrangement on the plate 30, markings 34a and 34b are applied to the plate 30. Thus the plate 30 can be imprinted in a suitable manner, for example with a circular symbol.

The actuating area 14b of the right contact switching arrangement is alternatively identified by markings 34c and 34d, which are applied directly to the polymer film 24, such as underneath the transparent plate 30. The surface of the plate 30 is not disrupted by this arrangement of the markings 34c and 34d underneath it.

Figure 2:
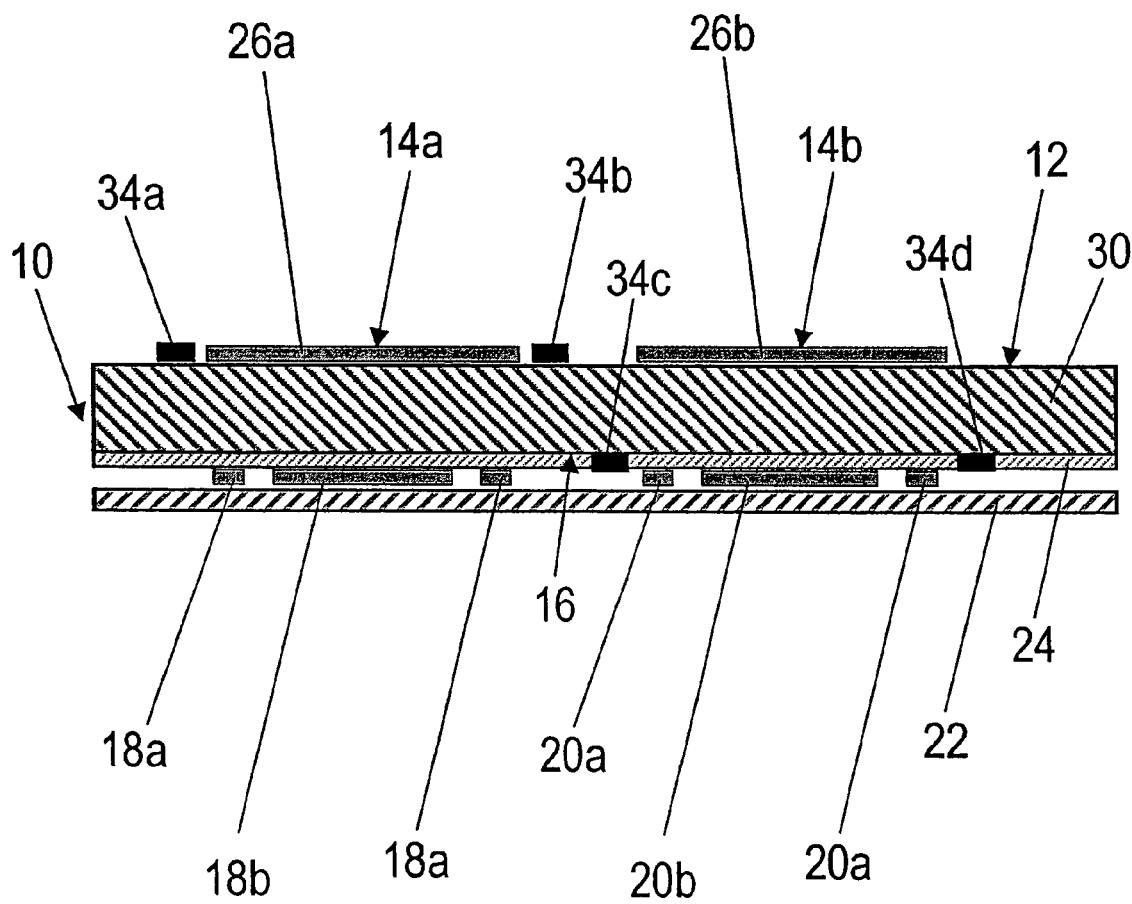
FIG. 2 shows a schematic plan view in section of a layout of two capacitive contact switching arrangements in accordance with a further embodiment, wherein the light-reflecting film is applied on the side of a transparent plate facing away from the user, and an additional electrode is attached on the side facing the user.

FIG. 2 shows, in a schematic plan view and in section, a layout of two capacitive contact switching arrangements in accordance with a further embodiment. At the top 12 facing the user, the transparent plate 30 has a switching area 14a, which is formed by an upper electrode 26a. In the area of the right contact switching arrangement an upper electrode 26b forms the switching area 14b. The polymer film 24 is applied to the underside 16 of the plate 30. Electrodes 18b or 20b are assigned to each switching face 14a or 14b on an electronic printed circuit board 22 also attached to the underside 16. The length of the upper electrodes 26a and 26b covers the electrode arrangements of the electrodes 18b and 18a, or 20b and 20a. The electrodes 26a and 26b are constructed of a transparent material.

The lower electrodes 18a and 18b, or 20a and 20b are also controlled by a switching arrangement (not shown), also arranged on the electronic printed circuit board so that each acts as a series connection of two capacitors. The coupling between the electrodes 18a and 18b or 20a and 20b is provided via the respective upper electrode 26a or 26b. If, for example, the user touches the upper electrode 26a of the left contact switching arrangement with a finger, it is connected with ground and the coupling of the signal between the electrodes 18a and 18b is greatly weakened. A switching process is thus triggered at the left contact switching arrangement. A switching process is also triggered when touching the switching area 14b of the right contact switching arrangement.

The markings 34a and 34b arranged next to the switching area 14a, or the upper electrode 26a are intended to make finding the switching area 14a easier. Thus the markings 34a and 34b are imprinted on the top 12 of the plate 30. Alternatively, the markings 34a and 34b in the vicinity of or near the switching area 14b, or the electrode 26b are imprinted directly on the polymer film 24.

Figure 3:
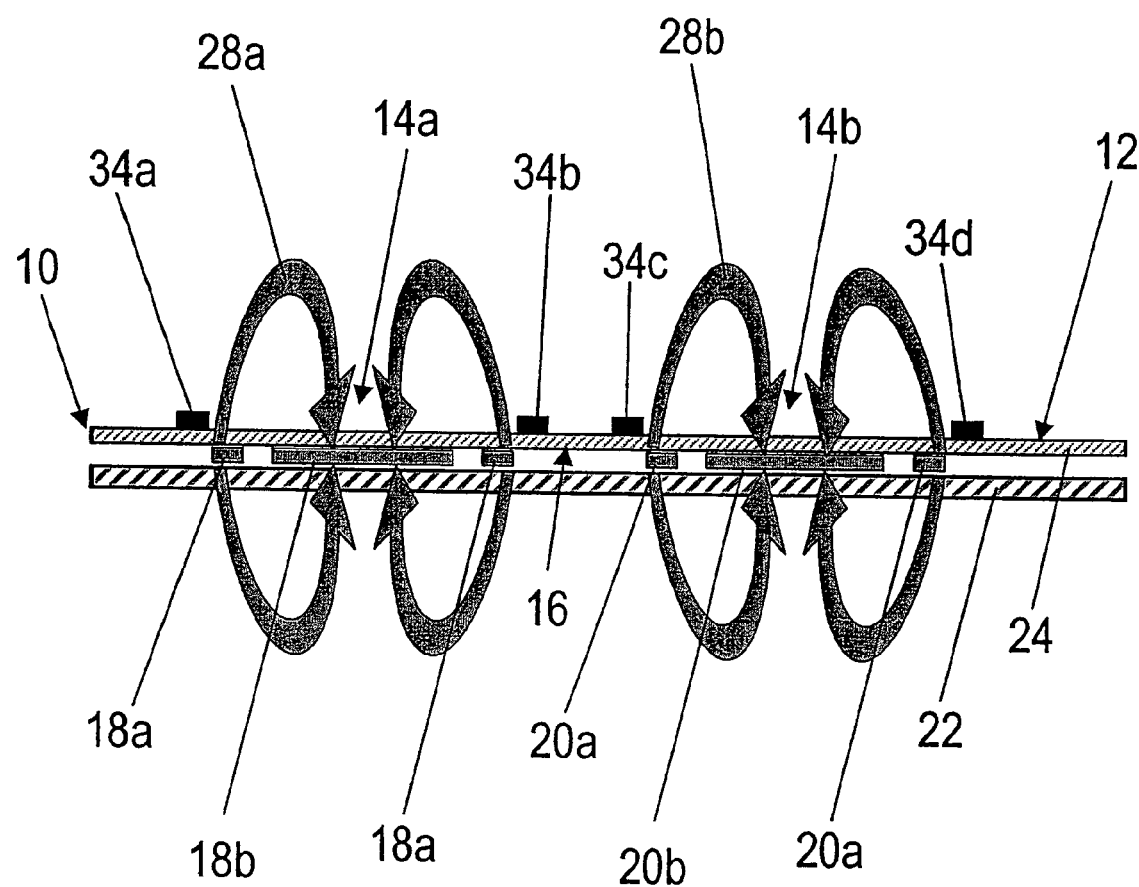
FIG. 3 shows a schematic plan view in section of a layout of two contact switching arrangements based on electrical field effects in accordance with another embodiment, wherein the cover is formed by the light-reflecting film.

FIG. 3 shows, in a schematic plan view and in section, a layout of two contact switching arrangements based on an electrical field effect in accordance with another embodiment. Accordingly, the cover 10 is formed directly by the polymer film 24. A switching area 14a, which is identified by the markings 34a and 34b on the polymer film 24, is arranged on the left contact switching arrangement on the top 12 of the cover 10. In the same way a switching area 14b, which is identified by the markings 34c and 34d on the polymer film 24, is arranged on the right contact switching arrangement on the top 12 of the cover 10. Electrode arrangements, respectively including of an electrode 18b or 20b, which is enclosed in a ring shape by a further electrode 18a or 20a, and assigned to the switching areas 14a or 14b, are arranged on the underside 16 of the cover 10, or of the polymer film 24. These electrode arrangements are arranged on an electronic printed circuit board 22, which has still further electronic circuit arrangements (not shown) previously explained in view of FIG. 1.

Figure 4:
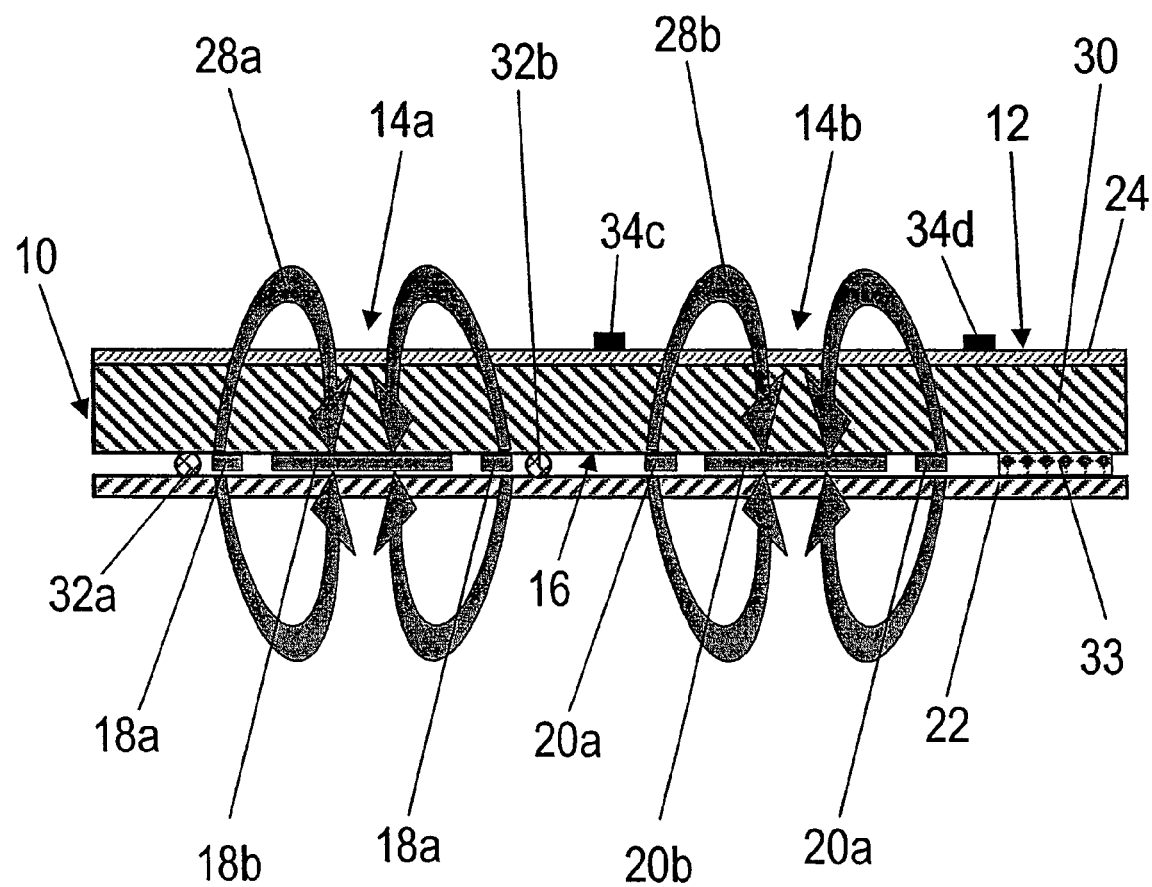
FIG. 4 shows a schematic plan view in section of a layout of two contact switching arrangements based on electrical field effects in accordance with yet another embodiment, wherein the light-reflecting film is applied to the side of a transparent plate facing the user, and additional illuminated displays are integrated into it.

FIG. 4 shows, in a schematic plan view and in section, a layout of two contact switching arrangements based on electrical field effects in accordance with a still further embodiment.

FIG. 4 substantially shows the same components as those already shown in FIG. 1. Those components which have the same reference numbers as the corresponding components in FIG. 1 identify the same or comparable components. Thus, only the differences with the embodiment represented and explained in FIG. 1 will be discussed in view of FIG. 4.

Accordingly, the polymer film 24 is applied to the top 12 of the non-conducting plate 30. The switching areas 14a and 14b are directly located on the top of the polymer film 24. The polymer film 24 provides a residual transmission of approximately 5% of the light in the visible wavelength range. Thus light-emitting diodes 32a and 32b, which radiate weakly through the transparent plate 30 and the polymer film 24, are arranged in the border area of the switching area 14a of the left contact switching arrangement for optically delimiting it on the electronic printed circuit board 22.

The switching area 14b of the right contact switching arrangement is identified by markings 34c and 34d imprinted on the polymer film 24. A separately controllable 7-segment display is arranged to the right next to the switching area 14b on the underside 16 of the cover 10. This is used to indicate to the user which temperature value is set at the right contact switching arrangement. During this it is possible, for example, to set an increased value by continuously touching the right contact switching arrangement.

Light-emitting diodes, self-illuminated graphic displays, 7-segment displays, backlit displays, such as backlit liquid crystal displays, backlit symbols and similar optical displays are possible displays. These can be used, for example, as status indicators for the operational status of the electrical device which is operated by the contact switching arrangement. It is also possible to indicate the switching area, its position and respective switching status by a color change. Backlit arrangements purely for design purposes, for example illuminated writing, are also conceivable.

With all of the above described embodiments the polymer film 24 can be connected in various ways with the plate 30, for example by laminating or by an adhesive connection. The polymer film 24 can also be heat-sealed.

For generating different metallic appearances, the polymer film 24 can be smooth for representing a smooth reflecting surface. However, the polymer film 24 can also be structured for achieving a different visual appearance, for example similar to a brushed high-grade steel surface, by diffuse reflection.

In accordance with a further embodiment, the polymer film is flexible, so that it is also possible to form curved control panels, for example by using curved plates.

German Patent Reference 103 20 548.9-42, the priority document corresponding to this invention, and its teachings are incorporated, by reference, into this specification.

What is claimed is:

1. A contact switching arrangement with a flat, electrically non-conducting cover (10) which forms a switching area (14a, 14b) on a top (12) facing an user and has an underside (16) facing away from the user, at which at least one electrode (18a, 18b, 20a, 20b) is arranged and is connected with a switching arrangement (22) for triggering a contact signal when a finger of the user or a conducting body approaches, the contact switching arrangement comprising:
   a light-reflecting, electrically non-conducting film (24) over at least a portion of the cover, acting as a non-conductor.

2. The contact switching arrangement in accordance with claim 1, Wherein two lower electrodes (18a and 18b, 20a and 20b) are arranged next to each other on the underside (16) of the cover (10), and an upper electrode (26a, 26b) is arranged on the switching area (14a, 14b), and have a length that covers the two electrodes (18a and 18b, 20a and 20b) arranged on the underside (16), which are wired together as a series connection of two capacitors and are capacitively connected by the upper electrode (26a, 26b).

3. The contact switching arrangement in accordance with claim 2, wherein the upper electrode (26a, 26b) is made of a transparent material.

4. The contact switching arrangement in accordance with claim 1, wherein two electrodes (18a and 18b, 20a and 20b) are arranged next to each other on the underside (16) of the cover (10), which are connected with a switching arrangement (22) for generating an electrical alternating field (28a, 28b) which penetrates the cover (10) at least near the switching area (14a, 14b) and for detecting disturbances of the electrical alternating field (28a, 28b) in case of the approach of the finger of the user, or of a similar conducting body, to the switching area (14a, 14b).

5. The contact switching arrangement in accordance with claim 1, wherein the cover is made from the light-reflecting film (24).

6. The contact switching arrangement in accordance with claim 1, wherein the cover (10) is formed of a transparent plate (30), which has the switching area (14a, 14b) on the top (12) facing the user, and the light-reflecting film (24) on the underside (16) facing away from the user.

7. The contact switching arrangement in accordance with claim 1, wherein the cover (10) is formed by a non-conducting plate (30) which has the light-reflecting film (24) and the switching area (14a, 14b) on the top (12) facing the user.

8. The contact switching arrangement in accordance with claim 1, wherein the light-reflecting film (24) has one of a smooth, a mirrored, and a structured surface, which reflects light in a diffuse manner.

9. The contact switching arrangement in accordance with claim 1, wherein the light-reflecting film (24) transmits light at least partially in a visible wavelength range.

10. The contact switching arrangement in accordance with claim 9, wherein at least one illuminated display (32a, 32b, 32c) is arranged on one of the underside (16) of the cover (10) and the light-reflecting film (24) facing away from the user.

11. The contact switching arrangement in accordance with claim 10, wherein the illuminated displays (32a, 32b, 32c) are formed by at least one of lamps, light-emitting diodes, self-illuminated graphic displays, 7-segment displays, backlit liquid crystal displays, backlit symbols and optical displays radiating though the light-reflecting film.

12. The contact switching arrangement in accordance with claim 1, wherein the position of the switching area (14a, 14b) is identified by at least one of a symbolic device and a similar marking (34a, 34b, 34c, 34d) on at least one of the cover (10) and the light-reflecting film (24).

13. The contact switching arrangement in accordance with claim 1, wherein the light-reflecting film (24) is flexible, and the flat cover (10) at least in some areas is one of curved, angled and has shapes differing from a flat shape, at least in some areas.

14. The contact switching arrangement in accordance with claim 1, wherein the film (24) is formed by a multi-layered non-metallic polymer film which reflects light in a mirror-like manner.

15. The contact switching arrangement in accordance with claim 14, wherein the multi-layered polymer film reflects light at an angle of incidence of 0° to 90°.

16. The contact switching arrangement in accordance with claim 14, wherein the multi-layered polymer film reflects more than 95% of visible light in a wave range of lambda=400 nm to 700 nm.

17. The contact switching arrangement in accordance with claim 16, wherein the multi-layered polymer film reflects light at an angle of incidence of 0° to 90°.

18. The contact switching arrangement in accordance with claim 17, wherein two electrodes (18a and 18b, 20a and 20b) are arranged next to each other on the underside (16) of the cover (10), which are connected with a switching arrangement (22) for generating an electrical alternating field (28a, 28b) which penetrates the cover (10) at least near the switching area (14a, 14b) and for detecting disturbances of the electrical alternating field (28a, 28b) in case of the approach of the finger of the user, or of a similar conducting body, to the switching area (14a, 14b).

19. The contact switching arrangement in accordance with claim 17, wherein two lower electrodes (18a and 18b, 20a and 20b) are arranged next to each other on the underside (16) of the cover (10), and an upper electrode (26a, 26b) is arranged on the switching area (14a, 14b), and have a length that covers the two electrodes (18a and 18b, 20a and 20b) arranged on the underside (16), which are wired together as a series connection of two capacitors and are capacitively connected by the upper electrode (26a, 26b).

20. The contact switching arrangement in accordance with claim 19, wherein the upper electrode (26a, 26b) is made of a transparent material.

21. The contact switching arrangement in accordance with claim 20, wherein the cover is made from the light-reflecting film (24).

22. The contact switching arrangement in accordance with claim 21, wherein the cover (10) is formed of a transparent plate (30), which has the switching area (14a, 14b) on the top (12) facing the user, and the light-reflecting film (24) on the underside (16) facing away from the user.

23. The contact switching arrangement in accordance with claim 22, wherein the cover (10) is formed by a non-conducting plate (30) which has the light-reflecting film (24) and the switching area (14a, 14b) on the top (12) facing the user.

24. The contact switching arrangement in accordance with claim 23, wherein the light-reflecting film (24) is applied to the transparent plate (30) by one of a lamination, a heat-seal, an adhesive and a fixed planar connection.

25. The contact switching arrangement in accordance with claim 24, wherein the transparent plate (30) is made of one of a glass, a plastic and a transparent material.

26. The contact switching arrangement in accordance with claim 25, wherein the light-reflecting film (24) has one of a smooth, a mirrored, and a structured surface, which reflects light in a diffuse manner.

27. The contact switching arrangement in accordance with claim 26, wherein the light-reflecting film (24) transmits light at least partially in a visible wavelength range.

28. The contact switching arrangement in accordance with claim 27, wherein at least one illuminated display (32a, 32b, 32c) is arranged on one of the underside (16) of the cover (10) and the light-reflecting film (24) facing away from the user.

29. The contact switching arrangement in accordance with claim 20, wherein the illuminated displays (32a, 32b, 32c) are formed by at least one of lamps, light-emitting diodes, self-illuminated graphic displays, 7-segment displays, backlit liquid crystal displays, backlit symbols and optical displays radiating through the light-reflecting film.

30. The contact switching arrangement in accordance with claim 29, wherein the position of the switching area (14a, 14b) is identified by at least one of a symbolic device and a similar marking (34*a*, 34*b*, 34*c*, 34*d*) on at least one of the cover (10) and the light-reflecting film (24).

31. The contact switching arrangement in accordance with claim 30, wherein the light-reflecting film (24) is flexible, and the flat cover (10) at least in some areas is one of curved, angled and has shapes differing from a flat shape.

32. The contact switching arrangement in accordance with claim 22, wherein the light-reflecting film (24) is applied to the transparent plate (30) by one of a lamination, a heat-seal, an adhesive and a fixed planar connection.

33. The contact switching arrangement in accordance with claim 22, wherein the transparent plate (30) is made of one of a glass, a plastic and a transparent material.

* * * * *